(12) United States Patent
Baek et al.

(10) Patent No.: US 10,833,040 B2
(45) Date of Patent: Nov. 10, 2020

(54) SEMICONDUCTOR PACKAGE

(71) Applicant: SAMSUNG ELECTRONICS CO., LTD., Suwon-si (KR)

(72) Inventors: Yong Ho Baek, Suwon-Si (KR); Young Sik Hur, Suwon-Si (KR); Joo Hwan Jung, Suwon-Si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/015,815

(22) Filed: Jun. 22, 2018

(65) Prior Publication Data

US 2019/0189583 A1 Jun. 20, 2019

(30) Foreign Application Priority Data

Dec. 19, 2017 (KR) .................. 10-2017-0175275

(51) Int. Cl.
*H01L 23/00* (2006.01)
*H01L 23/498* (2006.01)
*H05K 1/18* (2006.01)

(52) U.S. Cl.
CPC ........ *H01L 24/24* (2013.01); *H01L 23/49838* (2013.01); *H01L 24/20* (2013.01);
(Continued)

(58) Field of Classification Search
CPC ...... H01L 23/5389; H01L 24/19; H01L 24/20
See application file for complete search history.

(56) References Cited

U.S. PATENT DOCUMENTS 7,872,343 B1 * 1/2011 Berry .................. H01L 21/561
257/687
8,680,647 B2 3/2014 Yu et al.
(Continued)

FOREIGN PATENT DOCUMENTS

KR 10-2015-0009728 A 1/2015
KR 10-2017-0121671 A 11/2017
(Continued)

OTHER PUBLICATIONS

Notice of Reason for Rejection issued in corresponding Korean Patent Application No. 10-2017-0175275, dated Sep. 17, 2018; with English translation.
(Continued)

*Primary Examiner* — Stephen M Bradley
(74) *Attorney, Agent, or Firm* — Sughrue Mion, PLLC

(57) ABSTRACT

A semiconductor package includes a core member having a cavity penetrating through first and second surfaces, a semiconductor chip disposed in the cavity and having an active surface having connection, a passive component module disposed in the cavity, including a plurality of passive components and a resin portion encapsulating the plurality of passive components, and having a mounting surface from which connection terminals of the passive components are exposed, a connection member on the second surface and including a redistribution layer connected to the connection pads of the semiconductor chip and connection terminals of some of the plurality of passive components, connection terminals of the others of the plurality of passive components not being connected to the redistribution layer.

11 Claims, 12 Drawing Sheets

(52) U.S. Cl.
CPC ...... *H05K 1/185* (2013.01); *H01L 2224/0231* (2013.01); *H01L 2224/02375* (2013.01); *H01L 2224/02377* (2013.01); *H01L 2224/0401* (2013.01); *H01L 2224/05569* (2013.01); *H01L 2224/18* (2013.01); *H01L 2224/24195* (2013.01); *H01L 2924/19041* (2013.01); *H01L 2924/19042* (2013.01); *H01L 2924/19043* (2013.01); *H01L 2924/19105* (2013.01)

(56) References Cited

U.S. PATENT DOCUMENTS

| | | | |
|---|---|---|---|
| 8,803,306 B1 | 8/2014 | Yu et al. | |
| 8,809,996 B2 | 8/2014 | Chen et al. | |
| 9,391,041 B2 | 7/2016 | Lin | |
| 10,163,687 B2* | 12/2018 | Rae | H01L 23/3128 |
| 2004/0089943 A1* | 5/2004 | Kirigaya | H01L 23/49811 |
| | | | 257/723 |
| 2005/0269681 A1* | 12/2005 | Asahi | H01L 21/6835 |
| | | | 257/686 |
| 2012/0013021 A1* | 1/2012 | Kobayashi | H01L 23/49827 |
| | | | 257/774 |
| 2012/0032347 A1 | 2/2012 | Chang et al. | |
| 2015/0028463 A1 | 1/2015 | Ng | |
| 2015/0380392 A1 | 12/2015 | Pang et al. | |
| 2016/0260695 A1* | 9/2016 | Chung | H01L 25/105 |
| 2016/0315048 A1 | 10/2016 | Ho et al. | |
| 2017/0309571 A1 | 10/2017 | Yi et al. | |
| 2018/0114758 A1* | 4/2018 | Yao | H01L 21/485 |
| 2018/0145033 A1 | 5/2018 | Yi et al. | |
| 2019/0035758 A1 | 1/2019 | Hwang et al. | |

FOREIGN PATENT DOCUMENTS

| | | |
|---|---|---|
| KR | 10-2018-0058095 A | 5/2018 |
| KR | 10-2019-0013051 A | 2/2019 |
| TW | I423355 B | 1/2014 |
| TW | I565022 B | 1/2017 |
| TW | I573244 B | 3/2017 |

OTHER PUBLICATIONS

Communication dated May 24, 2019, issued by the Taiwan Patent Office in counterpart Taiwan Application No. 107122119.

* cited by examiner

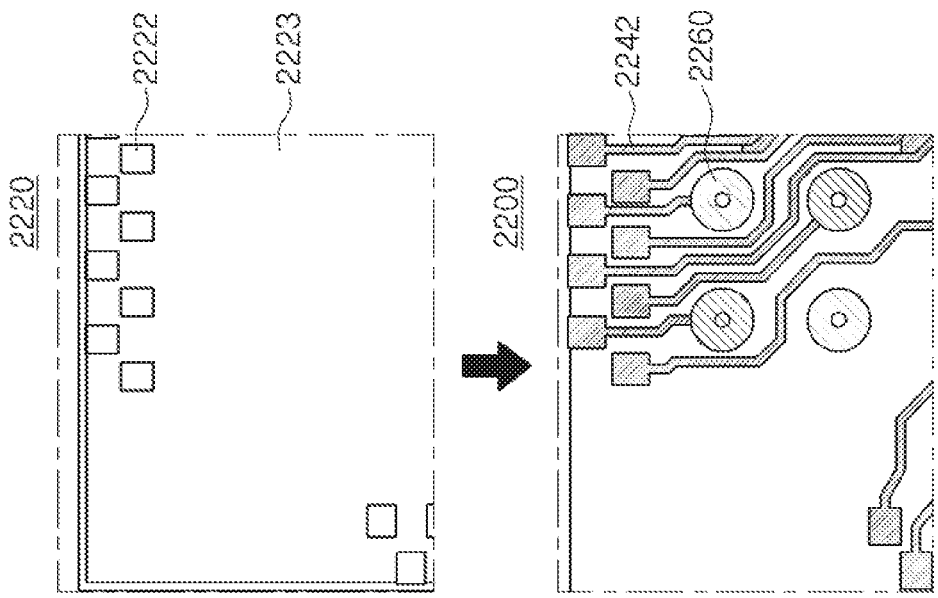
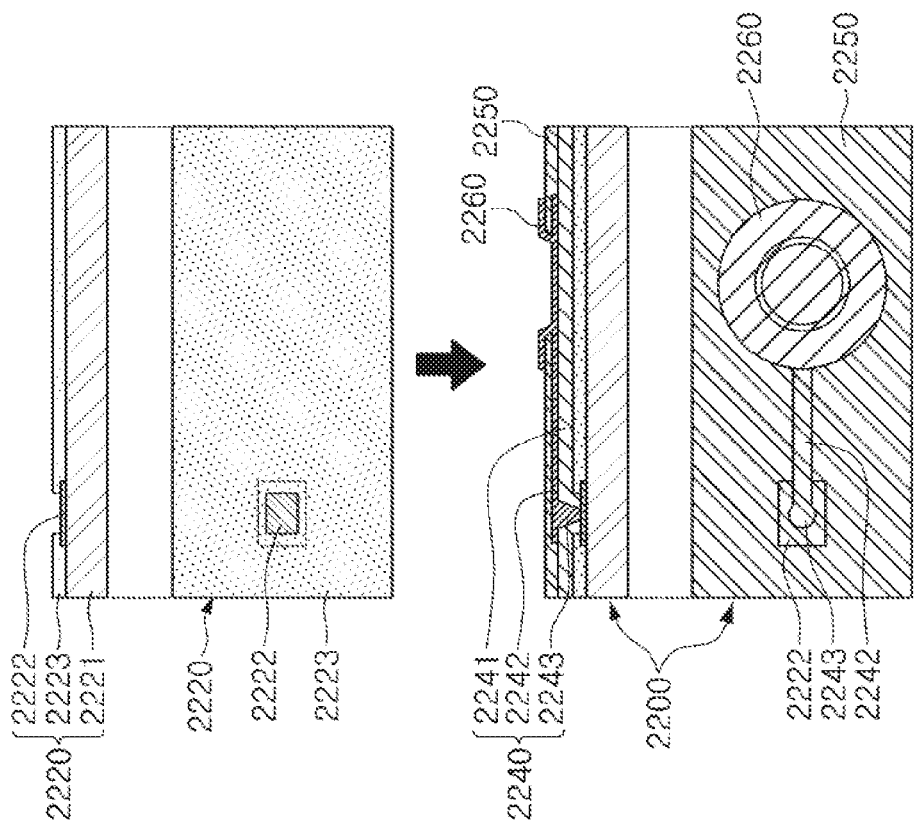
FIG. 3A
FIG. 3B

SEMICONDUCTOR PACKAGE

CROSS-REFERENCE TO RELATED APPLICATION(S)

This application claims benefit of priority to Korean Patent Application No. 10-2017-0175275 filed on Dec. 19, 2017 in the Korean Intellectual Property Office, the disclosure of which is incorporated herein by reference in its entirety.

TECHNICAL FIELD

The present disclosure relates to a semiconductor package.

BACKGROUND

In accordance with an increase in sizes of displays for mobile apparatuses, the necessity to increase capacity of batteries has increased. In accordance with the increase in the capacity of the batteries, areas occupied by the batteries in the mobile apparatuses have increased, and it has thus been required to reduce a size of a printed circuit board (PCB). Therefore, an area in which components are mounted has reduced, such that interest in modularization has continuously increased.

Meanwhile, an example of the related art of mounting a plurality of components may include chip-on-board (COB) technology. COB is a method of mounting individual passive elements and a semiconductor package on a printed circuit board using surface mount technology (SMT). However, in such a method, a large mounting area is required in order to maintain a minimum interval between components, electromagnetic interference (EMI) between the components is large, and in particular, a distance between the semiconductor chip and the passive components is great, such that electric noise is increased.

SUMMARY

An aspect of the present disclosure may provide a semiconductor package in which a plurality of passive components may be modularized in advance and used and may be applied to various circuits.

An aspect of the present disclosure may also provide a stack-type passive component module capable of further improving mounting properties of a package and utilizing a backside redistribution layer, and a semiconductor package including the same.

According to an aspect of the present disclosure, a semiconductor package may be provided, in which a plurality of passive components are modularized in advance to improve mounting properties and reduce a size and may be configured to be tunable to be appropriate for various types of packages or may be optimized using a stack structure.

According to an aspect of the present disclosure, a semiconductor package may include: a core member having first and second surfaces opposing each other and having a cavity penetrating through the first and second surfaces; a semiconductor chip disposed in the cavity of the core member and having an active surface having connection pads disposed thereon; a passive component module disposed in the cavity of the core member, including a plurality of passive components and a resin portion encapsulating the plurality of passive components, and having a mounting surface from which connection terminals of the plurality of passive components are exposed; a connection member disposed on the second surface of the core member and including a redistribution layer connected to the connection pads of the semiconductor chip and connection terminals of some of the plurality of passive components, connection terminals of the others of the plurality of passive components not being connected to the redistribution layer; and an encapsulant encapsulating the passive component module and the semiconductor chip disposed in the cavity.

According to another aspect of the present disclosure, a stack-type passive component module may include: first and second passive component modules including, respectively, a plurality of passive components and resin portions encapsulating the plurality of passive components, and having, respectively, first surfaces from which connection terminals of the plurality of passive components are exposed and second surfaces opposing the first surfaces. The second surfaces of the first and second passive component modules may face each other, and the first surfaces of the first and second passive component modules may be provided as upper and lower surfaces, respectively.

According to another aspect of the present disclosure, a semiconductor package may include: a core member having first and second surfaces opposing each other, having a cavity penetrating through the first and second surfaces, and including a wiring structure connecting the first and second surfaces to each other; a semiconductor chip disposed in the cavity of the core member and having an active surface having connection pads disposed thereon; the stack-type passive component module as described above disposed in the cavity of the core member; a connection member disposed on the second surface of the core member and including a first redistribution layer connected to the connection pads of the semiconductor chip and connection terminals disposed on a lower surface of the stack-type passive component module; an encapsulant covering the first surface of the core member and encapsulating the stack-type passive component module and the semiconductor chip; and a second redistribution layer disposed on the encapsulant and connected to the wiring structure of the core member and the connection terminal disposed on an upper surface of the stack-type passive component module.

BRIEF DESCRIPTION OF DRAWINGS

The above and other aspects, features, and advantages of the present disclosure will be more clearly understood from the following detailed description taken in conjunction with the accompanying drawings, in which:

FIGS. 3A and 3B are schematic cross-sectional views illustrating states of a fan-in semiconductor package before and after being packaged;

DETAILED DESCRIPTION

Hereinafter, exemplary embodiments in the present disclosure will be described with reference to the accompanying drawings. In the accompanying drawings, shapes, sizes, and the like, of components may be exaggerated or shortened for clarity.

Herein, a lower side, a lower portion, a lower surface, and the like, are used to refer to a direction toward a mounting surface of the fan-out semiconductor package in relation to cross sections of the drawings, while an upper side, an upper portion, an upper surface, and the like, are used to refer to an opposite direction to the direction. However, these directions are defined for convenience of explanation, and the claims are not particularly limited by the directions defined as described above.

The meaning of a "connection" of a component to another component in the description includes an indirect connection through an adhesive layer as well as a direct connection between two components. In addition, "electrically connected" conceptually includes a physical connection and a physical disconnection. It can be understood that when an element is referred to with terms such as "first" and "second", the element is not limited thereby. They may be used only for a purpose of distinguishing the element from the other elements, and may not limit the sequence or importance of the elements. In some cases, a first element may be referred to as a second element without departing from the scope of the claims set forth herein. Similarly, a second element may also be referred to as a first element.

The term "an exemplary embodiment" used herein does not refer to the same exemplary embodiment, and is provided to emphasize a particular feature or characteristic different from that of another exemplary embodiment. However, exemplary embodiments provided herein are considered to be able to be implemented by being combined in whole or in part one with one another. For example, one element described in a particular exemplary embodiment, even if it is not described in another exemplary embodiment, may be understood as a description related to another exemplary embodiment, unless an opposite or contradictory description is provided therein.

Terms used herein are used only in order to describe an exemplary embodiment rather than limiting the present disclosure.

In this case, singular forms include plural forms unless interpreted otherwise in context.

Electronic Device

Figure 1:
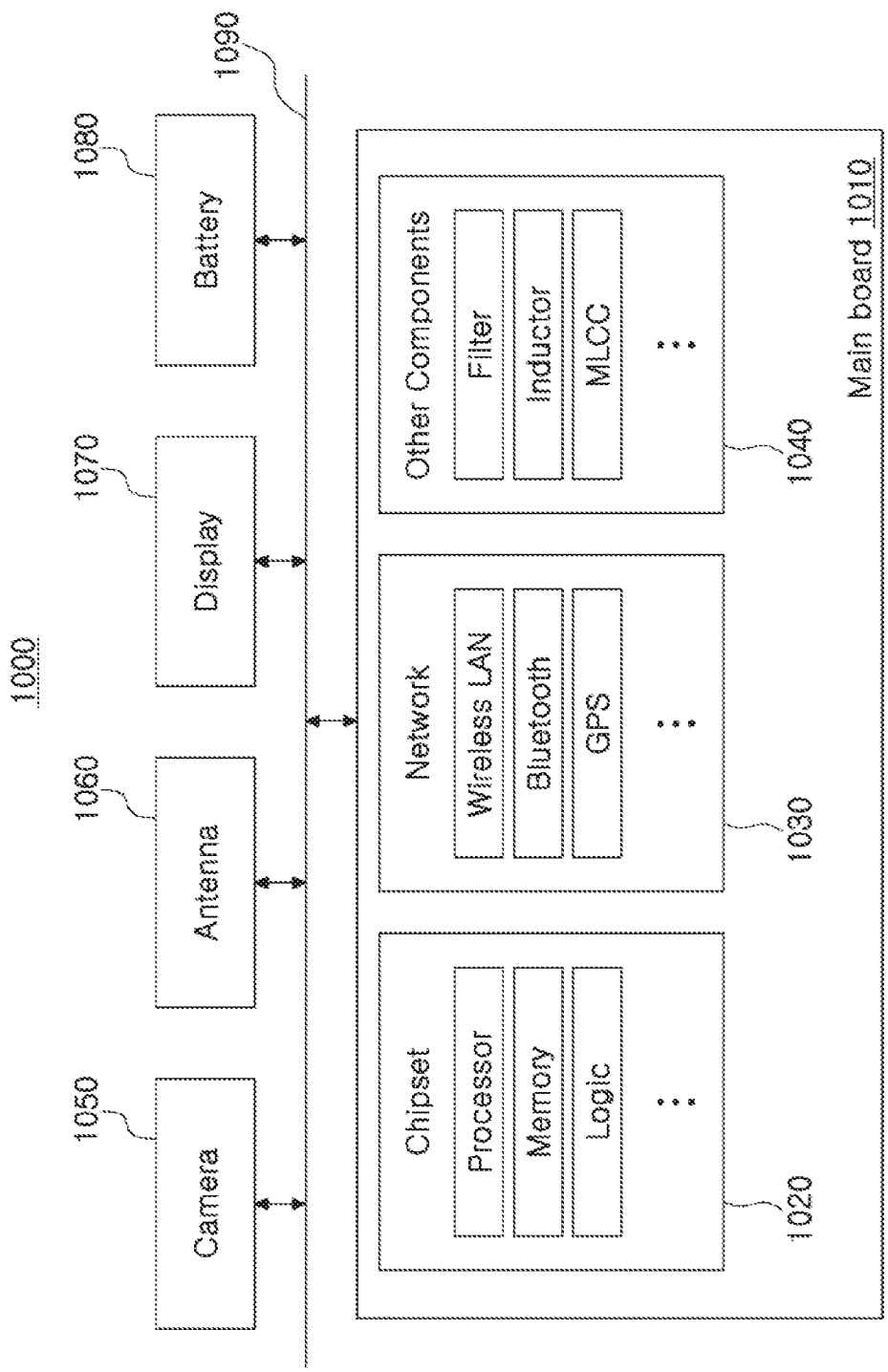
FIG. 1 is a schematic block diagram illustrating an example of an electronic device system.

FIG. 1 is a schematic block diagram illustrating an example of an electronic device system.

Referring to FIG. 1, an electronic device 1000 may accommodate a mainboard 1010 therein. The mainboard 1010 may include chip related components 1020, network related components 1030, other components 1040, and the like, physically or electrically connected thereto. These components may be connected to others to be described below to form various signal lines 1090.

The chip related components 1020 may include a memory chip such as a volatile memory (for example, a dynamic random access memory (DRAM)), a non-volatile memory (for example, a read only memory (ROM)), a flash memory, or the like; an application processor chip such as a central processor (for example, a central processing unit (CPU)), a graphics processor (for example, a graphics processing unit (GPU)), a digital signal processor, a cryptographic processor, a microprocessor, a microcontroller, or the like; and a logic chip such as an analog-to-digital (ADC) converter, an application-specific integrated circuit (ASIC), or the like. However, the chip related components 1020 are not limited thereto, but may also include other types of chip related components. In addition, the chip related components 1020 may be combined with each other.

The network related components 1030 may include protocols such as wireless fidelity (Wi-Fi) (Institute of Electrical And Electronics Engineers (IEEE) 802.11 family, or the like), worldwide interoperability for microwave access (Wi-MAX) (IEEE 802.16 family, or the like), IEEE 802.20, long term evolution (LTE), evolution data only (Ev-DO), high speed packet access+(HSPA+), high speed downlink packet access+(HSDPA+), high speed uplink packet access+ (HSUPA+), enhanced data GSM environment (EDGE), global system for mobile communications (GSM), global positioning system (GPS), general packet radio service (GPRS), code division multiple access (CDMA), time division multiple access (TDMA), digital enhanced cordless telecommunications (DECT), Bluetooth, 3G, 4G, and 5G protocols, and any other wireless and wired protocols, designated after the abovementioned protocols. However, the network related components 1030 are not limited thereto, but may also include a variety of other wireless or wired standards or protocols. In addition, the network related components 1030 may be combined with each other, together with the chip related components 1020 described above.

Other components 1040 may include a high frequency inductor, a ferrite inductor, a power inductor, ferrite beads, a low temperature co-fired ceramic (LTCC), an electromagnetic interference (EMI) filter, a multilayer ceramic capacitor (MLCC), or the like. However, other components 1040 are not limited thereto, but may also include passive components used for various other purposes, or the like. In addition, other components 1040 may be combined with each other, together with the chip related components 1020 or the network related components 1030 described above.

Depending on a type of the electronic device 1000, the electronic device 1000 may include other components that may or may not be physically or electrically connected to the mainboard 1010. These other components may include, for example, a camera module 1050, an antenna 1060, a display device 1070, a battery 1080, an audio codec (not illustrated), a video codec (not illustrated), a power amplifier (not illustrated), a compass (not illustrated), an accelerometer (not illustrated), a gyroscope (not illustrated), a speaker (not illustrated), a mass storage unit (for example, a hard disk drive) (not illustrated), a compact disk (CD) drive (not illustrated), a digital versatile disk (DVD) drive (not illustrated), or the like. However, these other components are not limited thereto, but may also include other components used for various purposes depending on a type of electronic device 1000, or the like.

The electronic device 1000 may be a smartphone, a personal digital assistant (PDA), a digital video camera, a digital still camera, a network system, a computer, a monitor, a tablet PC, a laptop PC, a netbook PC, a television, a video game machine, a smartwatch, an automotive component, or the like. However, the electronic device 1000 is not limited thereto, but may be any other electronic device processing data.

Figure 2:
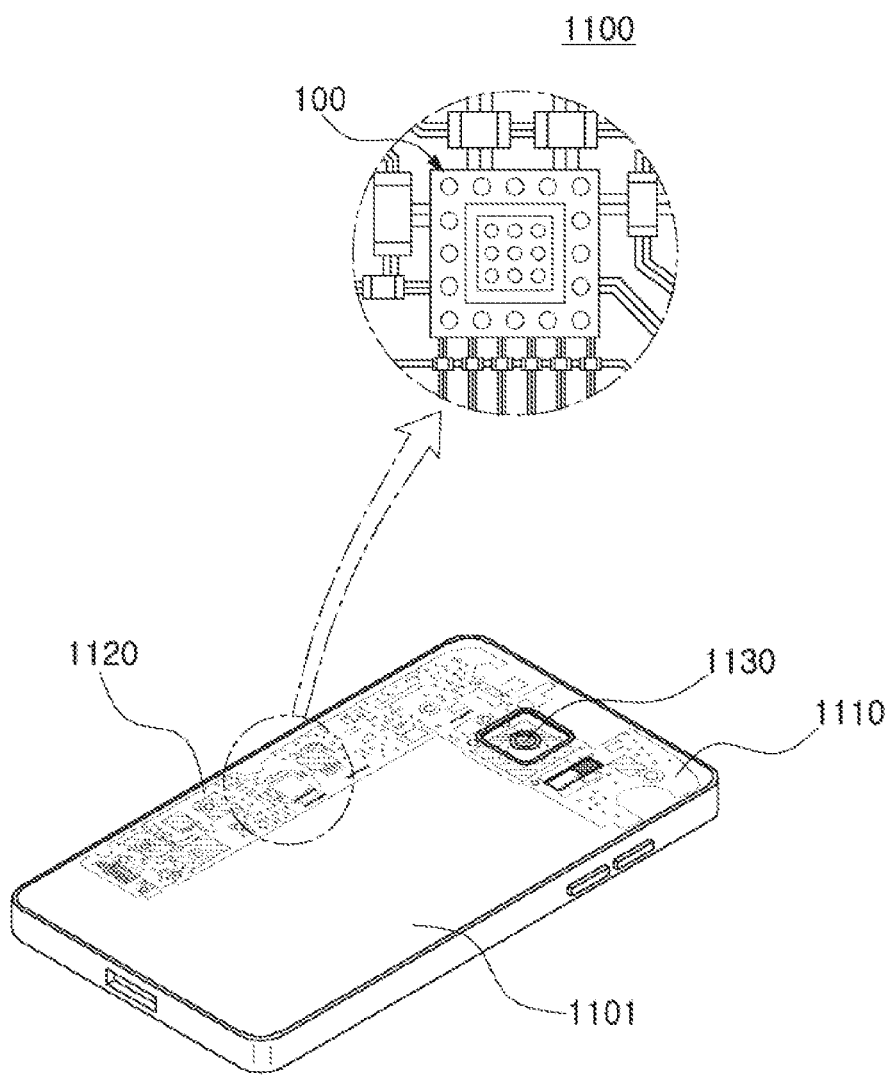
FIG. 2 is a schematic perspective view illustrating an example of an electronic device.

FIG. 2 is a schematic perspective view illustrating an example of an electronic device.

Referring to FIG. 2, a semiconductor package may be used for various purposes in the various electronic devices 1000 as described above. For example, a motherboard 1110 may be accommodated in a body 1101 of a smartphone 1100, and various electronic components 1120 may be physically or electrically connected to the motherboard 1110. In addition, other components that may or may not be physically or electrically connected to the mainboard 1010, such as a camera module 1130, may be accommodated in the body 1101. Some of the electronic components 1120 may be the chip related components, and the semiconductor package 100 may be, for example, an application processor among the chip related components, but is not limited thereto. The electronic device is not necessarily limited to the smartphone 1100, but may be other electronic devices as described above.

Semiconductor Package

Generally, numerous fine electrical circuits are integrated in a semiconductor chip. However, the semiconductor chip may not serve as a semiconductor finished product in oneself, and may be damaged due to external physical or chemical impact. Therefore, the semiconductor chip is not used in oneself, and is packaged and is used in an electronic device, or the like, in a package state.

The reason why semiconductor packaging is required is that there is a difference in a circuit width between the semiconductor chip and a mainboard of the electronic device in terms of electrical connection. In detail, a size of connection pads of the semiconductor chip and an interval between the connection pads of the semiconductor chip are very fine, but a size of component mounting pads of the mainboard used in the electronic device and an interval between the component mounting pads of the mainboard are significantly larger than those of the semiconductor chip. Therefore, it may be difficult to directly mount the semiconductor chip on the mainboard, and packaging technology for buffering a difference in a circuit width between the semiconductor and the mainboard is required.

A semiconductor package manufactured by the packaging technology may be classified as a fan-in semiconductor package or a fan-out semiconductor package depending on a structure and a purpose thereof.

The fan-in semiconductor package and the fan-out semiconductor package will hereinafter be described in more detail with reference to the accompanying drawings.

Fan-in Semiconductor Package

Figure 4:
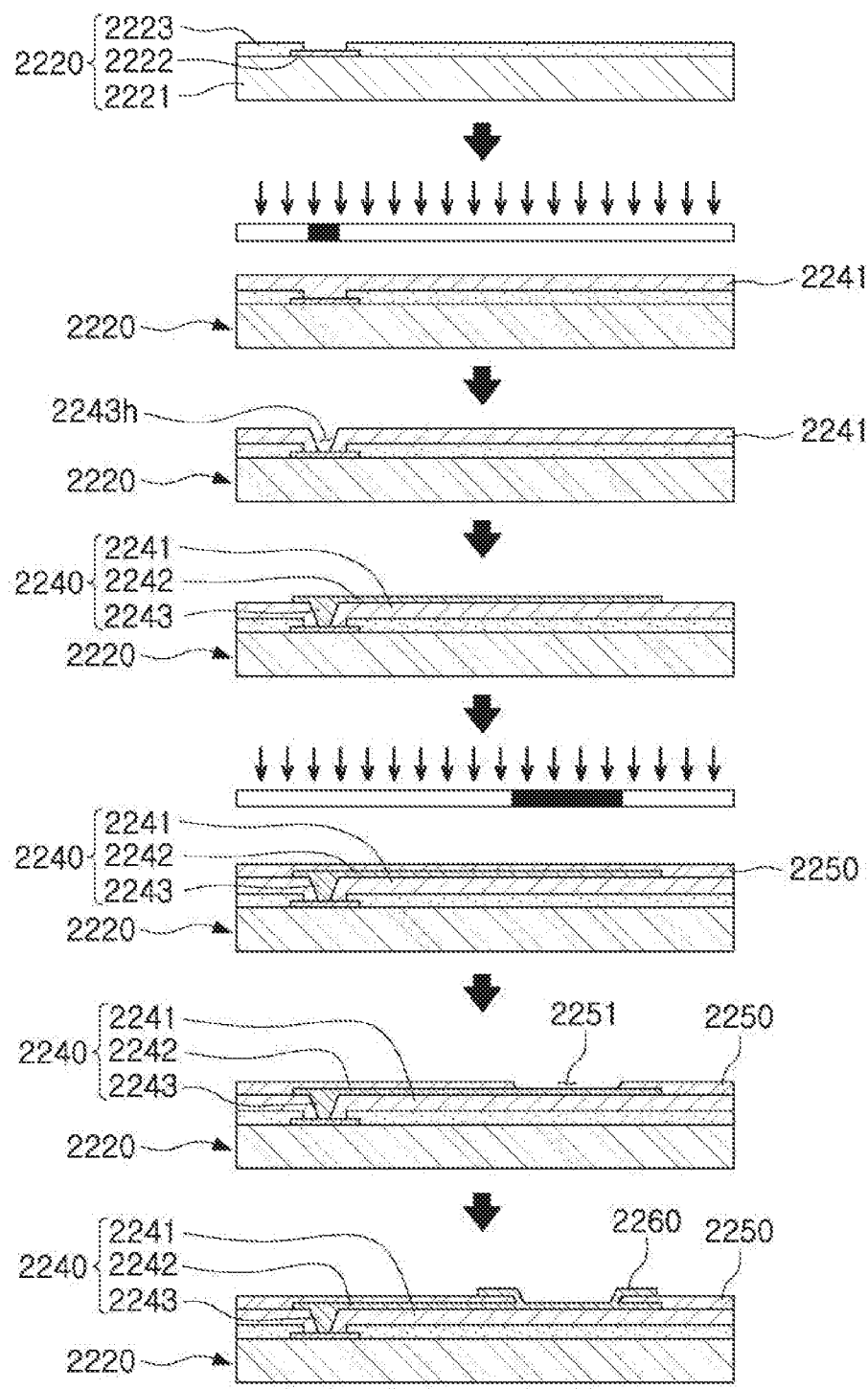
FIG. 4 is schematic cross-sectional views illustrating a packaging process of a fan-in semiconductor package.

FIGS. 3A and 3B are schematic cross-sectional views illustrating states of a fan-in semiconductor package before and after being packaged, and FIG. 4 is schematic cross-sectional views illustrating a packaging process of a fan-in semiconductor package.

Referring to FIGS. 3A to 4, a semiconductor chip 2220 may be, for example, an integrated circuit (IC) in a bare state, including a body 2221 including silicon (Si), germanium (Ge), gallium arsenide (GaAs), or the like, connection pads 2222 formed on one surface of the body 2221 and including a conductive material such as aluminum (Al), or the like, and a passivation layer 2223 such as an oxide film, a nitride film, or the like, formed on one surface of the body 2221 and covering at least portions of the connection pads 2222. In this case, since the connection pads 2222 may be significantly small, it may be difficult to mount the integrated circuit (IC) on an intermediate level printed circuit board (PCB) as well as on the mainboard of the electronic device, or the like.

Therefore, a connection member 2240 may be formed depending on a size of the semiconductor chip 2220 on the semiconductor chip 2220 in order to redistribute the connection pads 2222. The connection member 2240 may be formed by forming an insulating layer 2241 on the semiconductor chip 2220 using an insulating material such as a photoimagable dielectric (PID) resin, forming via holes 2243h opening the connection pads 2222, and then forming wiring patterns 2242 and vias 2243. Then, a passivation layer 2250 protecting the connection member 2240 may be formed, an opening 2251 may be formed, and an underbump metal layer 2260, or the like, may be formed. That is, a fan-in semiconductor package 2200 including, for example, the semiconductor chip 2220, the connection member 2240, the passivation layer 2250, and the underbump metal layer 2260 may be manufactured through a series of processes.

As described above, the fan-in semiconductor package may have a package form in which all of the connection pads, for example, input/output (I/O) terminals, of the semiconductor chip are disposed inside the semiconductor chip, and may have excellent electrical characteristics and be produced at a low cost. Therefore, many elements mounted in smartphones have been manufactured in a fan-in semiconductor package form. In detail, many elements mounted in smartphones have been developed to implement a rapid signal transfer while having a compact size.

However, since all I/O terminals need to be disposed inside the semiconductor chip in the fan-in semiconductor package, the fan-in semiconductor package has significant spatial limitations. Therefore, it is difficult to apply this structure to a semiconductor chip having a large number of I/O terminals or a semiconductor chip having a small size. In addition, due to the disadvantage described above, the fan-in semiconductor package may not be directly mounted and used on the mainboard of the electronic device. The reason is that even in the case in which a size of the I/O terminals of the semiconductor chip and an interval between the I/O terminals of the semiconductor chip are increased by a redistribution process, the size of the I/O terminals of the semiconductor chip and the interval between the I/O terminals of the semiconductor chip may not be sufficient to directly mount the fan-in semiconductor package on the mainboard of the electronic device.

Figure 5:
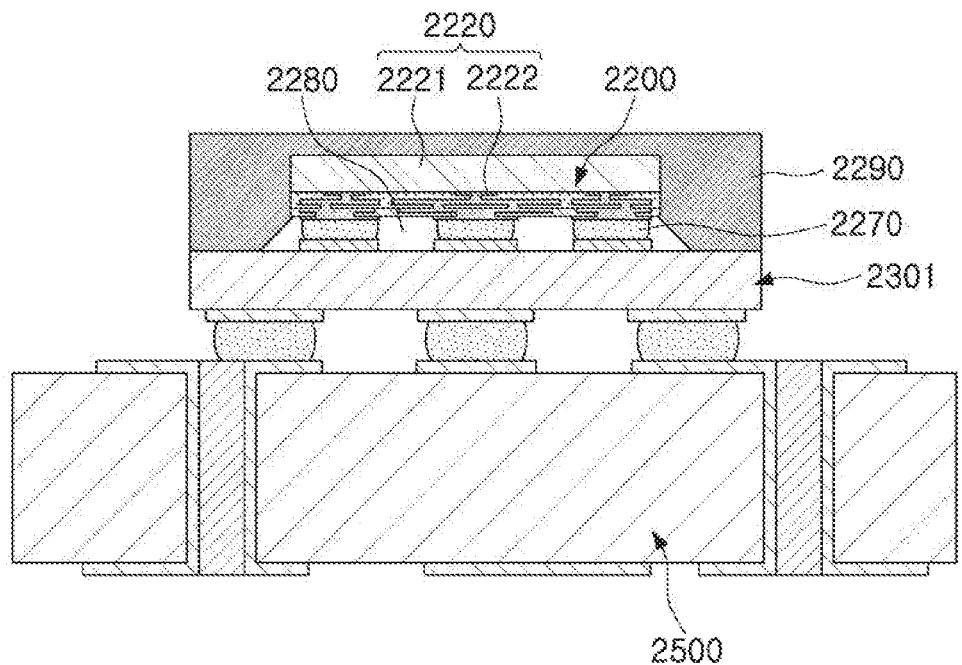
FIG. 5 is a schematic cross-sectional view illustrating a case in which a fan-in semiconductor package is mounted on an interposer substrate and is ultimately mounted on a mainboard of an electronic device.
Figure 6:
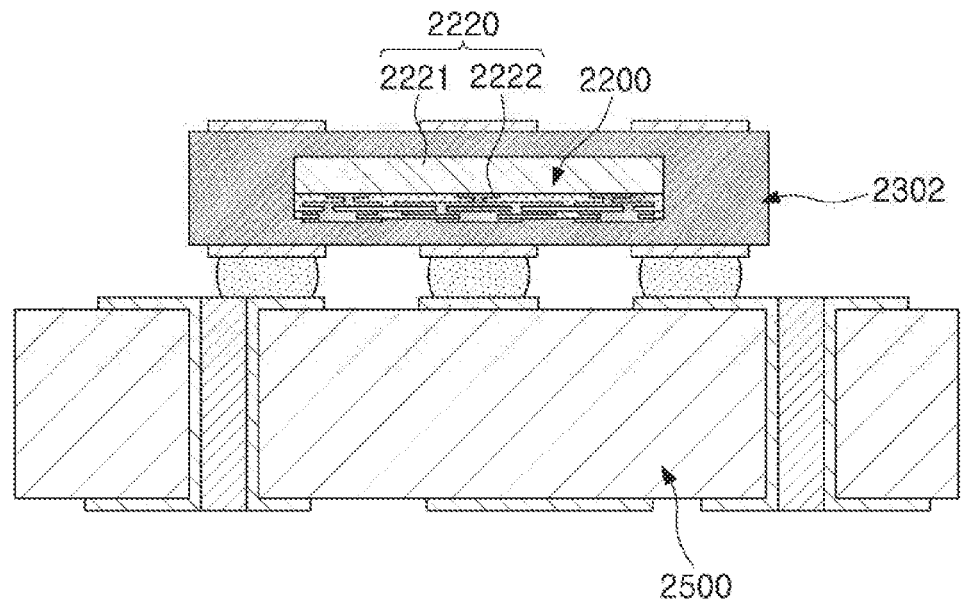
FIG. 6 is a schematic cross-sectional view illustrating a case in which a fan-in semiconductor package is embedded in an interposer substrate and is ultimately mounted on a mainboard of an electronic device.

FIG. 5 is a schematic cross-sectional view illustrating a case in which a fan-in semiconductor package is mounted on an interposer substrate and is ultimately mounted on a mainboard of an electronic device, and FIG. 6 is a schematic cross-sectional view illustrating a case in which a fan-in semiconductor package is embedded in an interposer substrate and is ultimately mounted on a mainboard of an electronic device.

Referring to FIG. 5, in a fan-in semiconductor package 2200, connection pads 2222, that is, I/O terminals, of a semiconductor chip 2220 may be redistributed once more through an interposer substrate 2301, and the fan-in semiconductor package 2200 may be ultimately mounted on a mainboard 2500 of an electronic device in a state in which it is mounted on the interposer substrate 2301. In this case, solder balls 2270, and the like, may be fixed by an underfill resin 2280, or the like, and an outer side of the semiconductor chip 2220 may be covered with an encapsulant 2290, or the like. Alternatively, as shown in FIG. 6, a fan-in semiconductor package 2200 may be embedded in a separate interposer substrate 2302, connection pads 2222, that is, I/O terminals, of a semiconductor chip 2220 may be redistributed once more by the interposer substrate 2302 in a state in which the fan-in semiconductor package 2200 is embedded in the interposer substrate 2302, and the fan-in semiconductor package 2200 may be ultimately mounted on a mainboard 2500 of an electronic device.

As described above, it may be difficult to directly mount and use the fan-in semiconductor package on the mainboard of the electronic device. Therefore, the fan-in semiconductor package may be mounted on the separate interposer substrate and be then mounted on the mainboard of the electronic device through a packaging process or may be mounted and used on the mainboard of the electronic device in a state in which it is embedded in the interposer substrate.

Fan-Out Semiconductor Package

Figure 7:
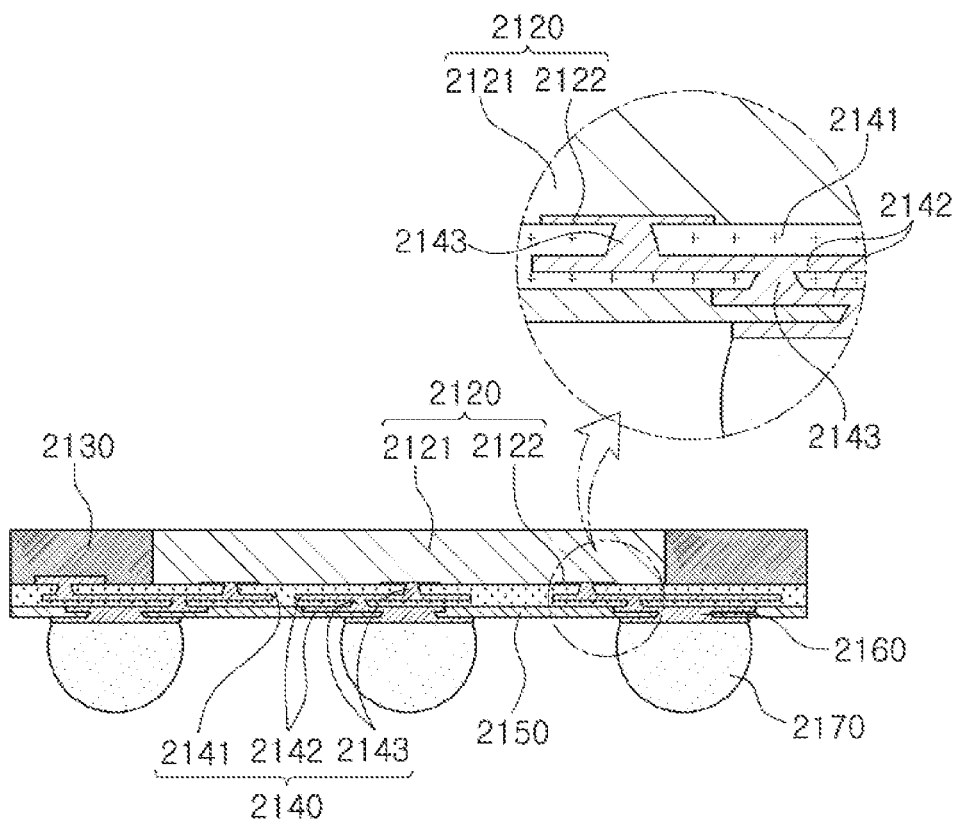
FIG. 7 is a schematic cross-sectional view illustrating a fan-out semiconductor package.

FIG. 7 is a schematic cross-sectional view illustrating a fan-out semiconductor package.

Referring to FIG. 7, in a fan-out semiconductor package 2100, for example, an outer side of a semiconductor chip 2120 may be protected by an encapsulant 2130, and connection pads 2122 of the semiconductor chip 2120 may be redistributed outwardly of the semiconductor chip 2120 by a connection member 2140. In this case, a passivation layer 2150 may further be formed on the connection member 2140, and an underbump metal layer 2160 may further be formed in openings of the passivation layer 2150. Solder balls 2170 may further be formed on the underbump metal layer 2160. The semiconductor chip 2120 may be an integrated circuit (IC) including a body 2121, the connection pads 2122, a passivation layer (not illustrated), and the like. The connection member 2140 may include an insulating layer 2141, redistribution layers 2142 formed on the insulating layer 2141, and vias 2143 electrically connecting the connection pads 2122 and the redistribution layers 2142 to each other.

In the present manufacturing process, the connection member 2140 may be formed after the encapsulant 2130 is formed outside the semiconductor chip 2120. In this case, a process for the connection member 2140 is performed from the via connecting the redistribution layers and the connection pads 2122 of the semiconductor chip 2120 to each other and the redistribution layers, and the vias 2143 may thus have a width that becomes small as they become to the semiconductor chip (see an enlarged region).

As described above, the fan-out semiconductor package may have a form in which I/O terminals of the semiconductor chip are redistributed and disposed outwardly of the semiconductor chip through the connection member formed on the semiconductor chip. As described above, in the fan-in semiconductor package, all I/O terminals of the semiconductor chip need to be disposed inside the semiconductor chip. Therefore, when a size of the semiconductor chip is decreased, a size and a pitch of balls need to be decreased, such that a standardized ball layout may not be used in the fan-in semiconductor package. On the other hand, the fan-out semiconductor package has the form in which the I/O terminals of the semiconductor chip are redistributed and disposed outwardly of the semiconductor chip through the connection member formed on the semiconductor chip as described above. Therefore, even in the case in which a size of the semiconductor chip is decreased, a standardized ball layout may be used in the fan-out semiconductor package as it is, such that the fan-out semiconductor package may be mounted on the mainboard of the electronic device without using a separate interposer substrate, as described below.

Figure 8:
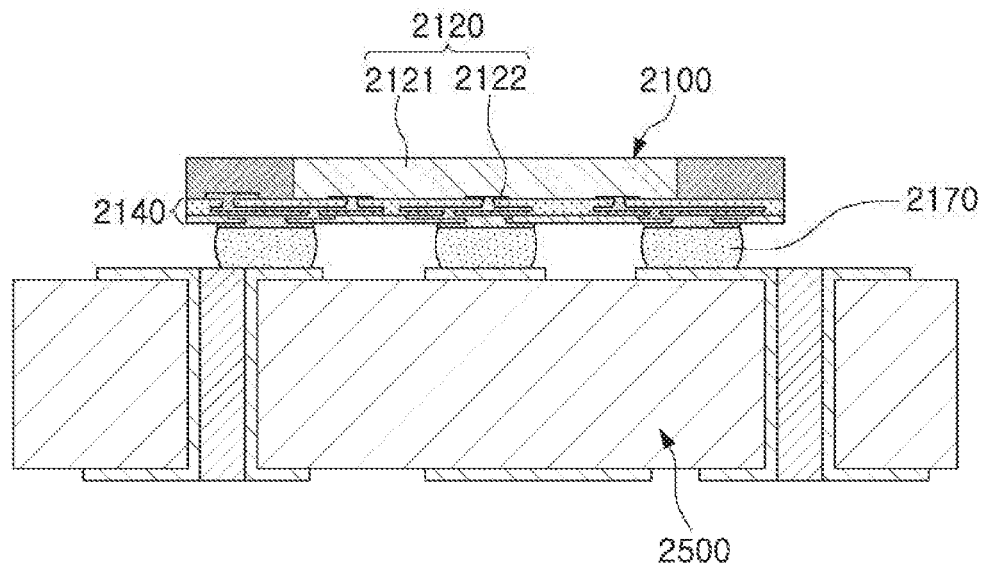
FIG. 8 is a schematic cross-sectional view illustrating a case in which a fan-out semiconductor package is mounted on a mainboard of an electronic device.

FIG. 8 is a schematic cross-sectional view illustrating a case in which a fan-out semiconductor package is mounted on a mainboard of an electronic device.

Referring to FIG. 8, a fan-out semiconductor package 2100 may be mounted on a mainboard 2500 of an electronic device through solder balls 2170, or the like. That is, as described above, the fan-out semiconductor package 2100 includes the connection member 2140 formed on the semiconductor chip 2120 and capable of redistributing the connection pads 2122 to a fan-out region that is outside of a size of the semiconductor chip 2120, such that the standardized ball layout may be used in the fan-out semiconductor package 2100 as it is. As a result, the fan-out semiconductor package 2100 may be mounted on the mainboard 2500 of the electronic device without using a separate interposer substrate, or the like.

As described above, since the fan-out semiconductor package may be mounted on the mainboard of the electronic device without using the separate interposer substrate, the fan-out semiconductor package may be implemented at a thickness lower than that of the fan-in semiconductor package using the interposer substrate. Therefore, the fan-out semiconductor package may be miniaturized and thinned. In addition, the fan-out semiconductor package has excellent thermal characteristics and electrical characteristics, such that it is particularly appropriate for a mobile product. Therefore, the fan-out semiconductor package may be implemented in a form more compact than that of a general package-on-package (POP) type using a printed circuit board (PCB), and may solve a problem due to the occurrence of a warpage phenomenon.

Meanwhile, the fan-out semiconductor package refers to package technology for mounting the semiconductor chip on the mainboard of the electronic device, or the like, as described above, and protecting the semiconductor chip from external impacts, and is a concept different from that of a printed circuit board (PCB) such as an interposer substrate, or the like, having a scale, a purpose, and the like, different from those of the fan-out semiconductor package, and having the fan-in semiconductor package embedded therein.

Hereinafter, various exemplary embodiments of the present disclosure will be described in detail with reference to the accompanying drawings.

Figure 9:
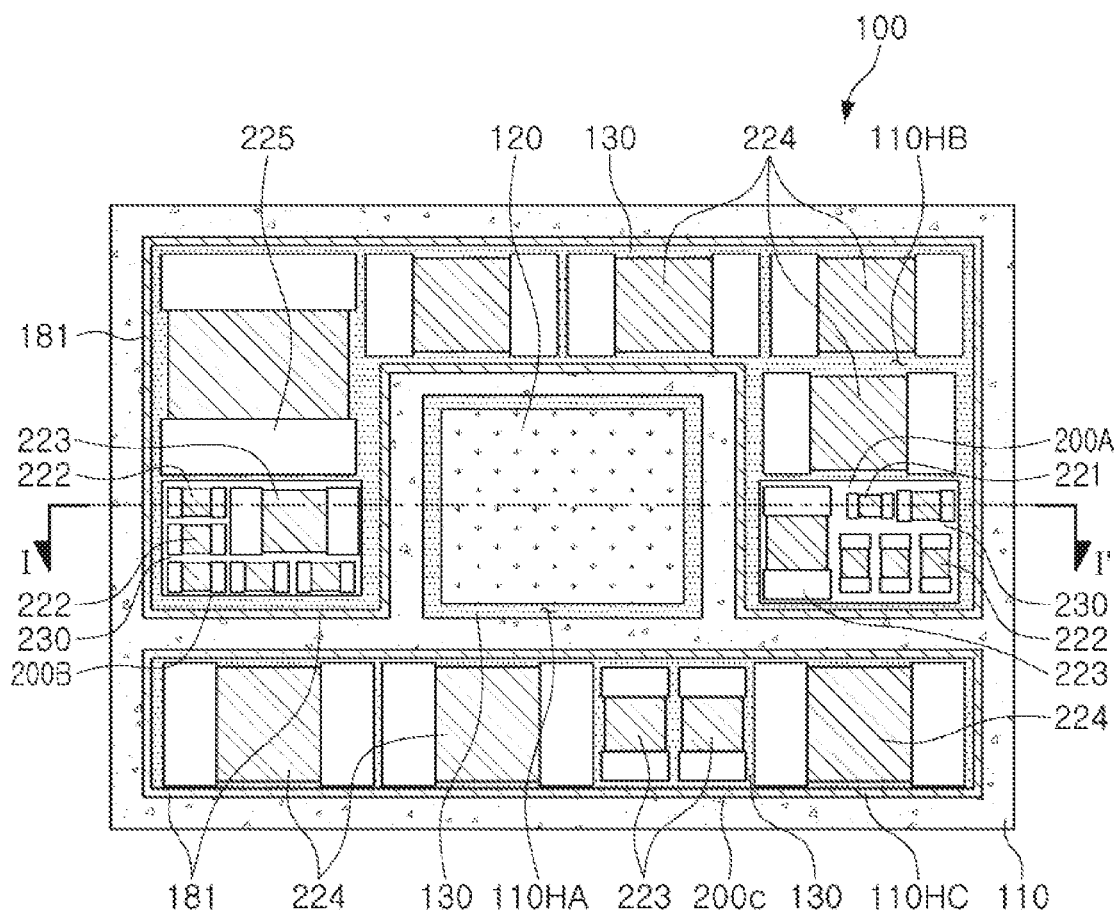
FIG. 9 is a plan view illustrating a semiconductor package according to an exemplary embodiment in the present disclosure.
Figure 10:
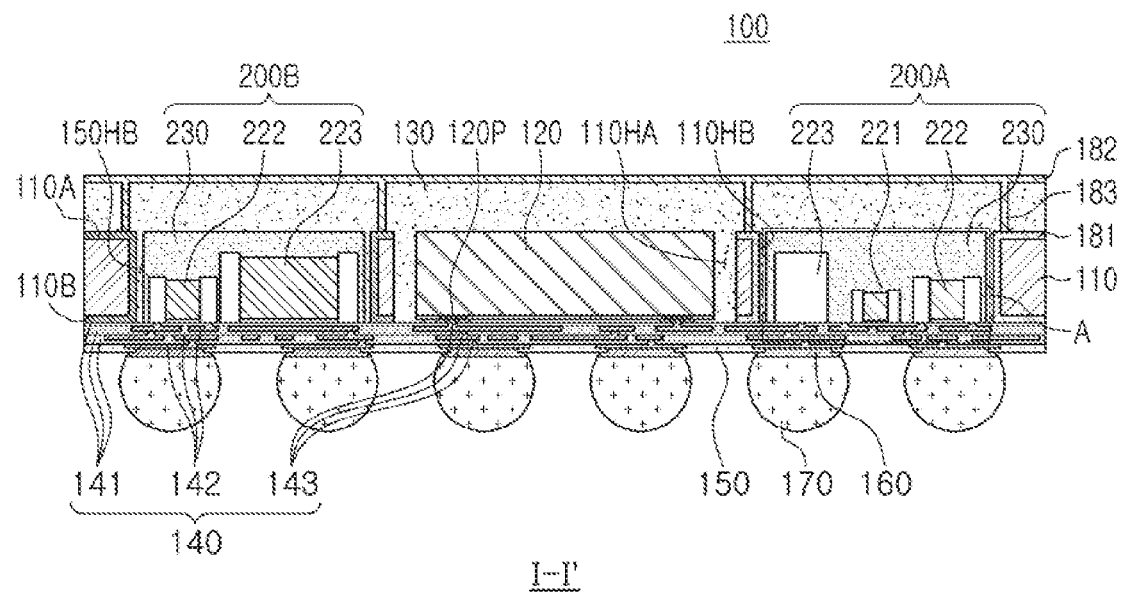
FIG. 10 is a cross-sectional view taken along line I-I' of the semiconductor package of FIG. 9.
Figure 11:
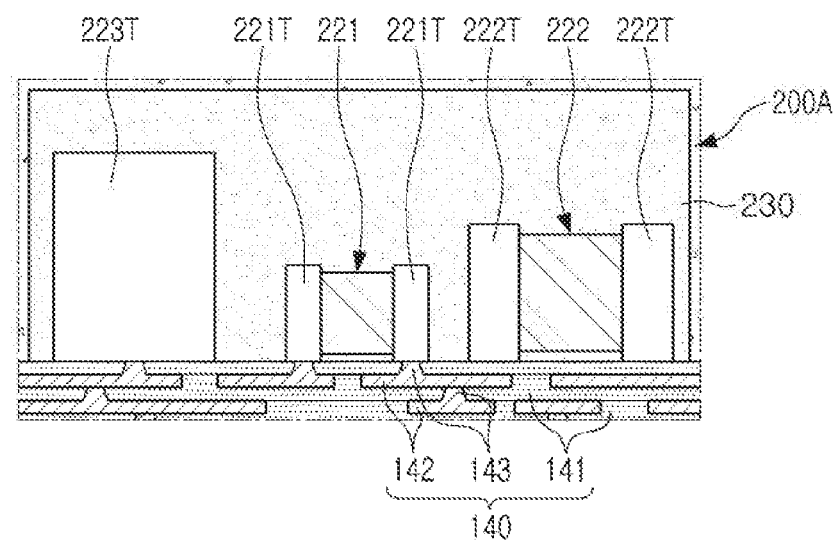
FIG. 11 is an enlarged cross-sectional view illustrating a partial region (region A) of the semiconductor package illustrated in FIG. 9.
Figure 12:
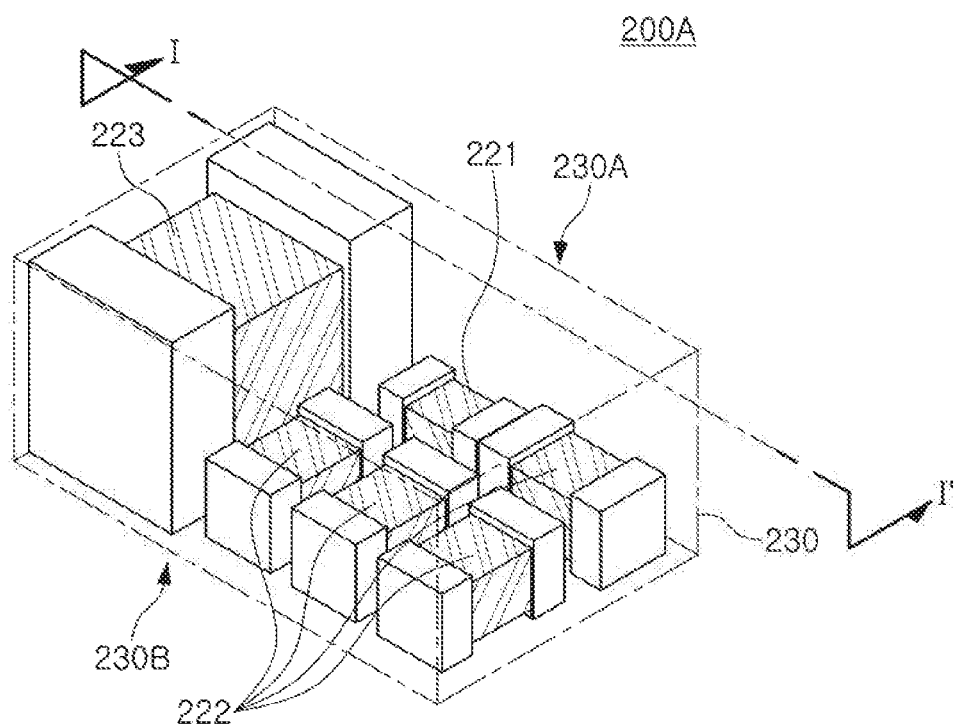
FIG. 12 is a schematic perspective view illustrating a passive component module used in the semiconductor package of FIG. 9.
Figure 13:
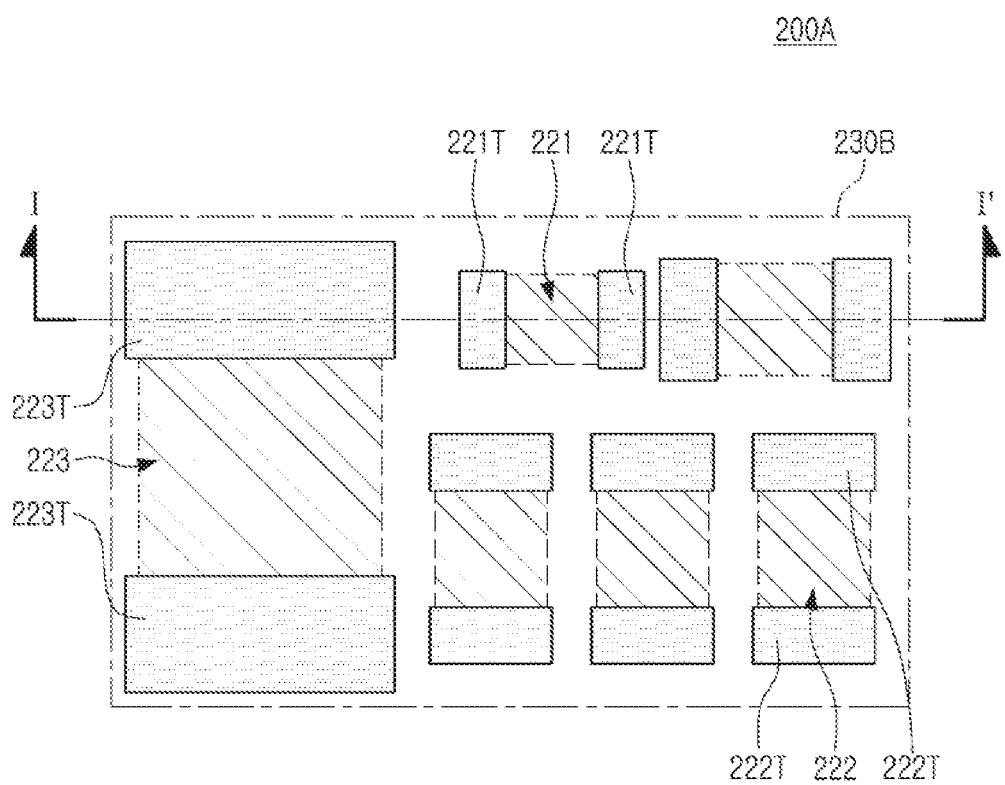
FIG. 13 is a bottom view illustrating the passive component module of FIG. 12.

FIG. 9 is a schematic plan view illustrating a semiconductor package according to an exemplary embodiment in the present disclosure. FIG. 10 is a cross-sectional view taken along line I-I' of the semiconductor package of FIG. 9. FIG. 11 is an enlarged cross-sectional view illustrating a partial region (region A) of the semiconductor package illustrated in FIG. 9. FIG. 12 is a schematic perspective view illustrating a passive component module used in the semiconductor package of FIG. 9. FIG. 13 is a bottom view illustrating the passive component module of FIG. 12.

Referring to the drawings, a semiconductor package 100 according to the present exemplary embodiment may include a core member 110 having a first surface 110A and a second surface 110B opposing each other and having to third cavities 110HA, 110HB, and 110HC, a semiconductor chip 120 disposed in the first cavity 110HA of the core member 110, a plurality of passive components 221, 222, 223, 224, and 225 disposed in the second and third cavities 110HB and 110HC of the core member 110, a connection member 140 disposed on the second surface 110B of the core member 110, and an encapsulant 130 encapsulating the plurality of passive components 221, 222, 223, 224, and 225 and the semiconductor chip 120.

The semiconductor chip 120 may have an active surface on which connection pads 120P are disposed. The connection member 140 may have a redistribution layer 142 connected to the connection pads 120P of the semiconductor chip 120.

The plurality of passive components 221 to 225 used in the present exemplary embodiment may have different sizes and heights. For example, the plurality of passive components 221 to 225 may be capacitors such as multilayer ceramic capacitors (MLCCs) and low inductance chip capacitors (LICCs), inductors, beads, various other kinds of filters, or the like, and the semiconductor package 100 may include a combination of various passive components 221 to 225 depending on a function thereof. For example, several ten passive components may be mounted in one semiconductor package.

The plurality of passive components 221 to 225 may have various sizes and heights depending on their performance, capacitances, and the like. In the present exemplary embodiment, the plurality of passive components 221 to 225 may be divided into first to fifth passive components 221 to 225 in a sequence of a smaller size and height. As an example, the first to third passive components 221, 222, and 223 may have relatively small sizes and the fourth and fifth passive components 224 and 225 may have relatively large sizes.

In the present exemplary embodiment, the first to third passive components 221, 222, and 223 may be provided as first to third passive component modules 200A, 200B, and 200C in which they are grouped depending on regions in which they are mounted. The first to third passive component modules 200A, 200B, and 200C may include a plurality of first to third passive components 221, 222, and 223 and resin portions 230 packaging the plurality of first to third passive components 221, 222, and 223 to bind the plurality of first to third passive components 221, 222, and 223.

In the passive components having the relatively small sizes, a delamination phenomenon may occur due to insufficient close adhesion caused by small mounting areas, or a serious alignment defect of the passive components having the relatively small sizes and heights may occur due to a rapid molding flow velocity in a space between the passive components having the relatively large sizes and heights in a molding process of forming the encapsulant 130.

In order to prevent these defects, the passive components having the small sizes may be grouped depending on the regions in which they are mounted so that a handling unit becomes large, such that they may be provided as the passive component modules 200A, 200B, and 200C.

In the present exemplary embodiment, the first to third passive component modules 200A, 200B, and 200C may include the plurality of passive components 221, 222, and 223 and the resin portions 230 packaging the plurality of passive components 221, 222, and 223.

The first to third passive component modules 200A, 200B, and 200C may be disposed in different cavities, and may be mounted together with the passive components having the relatively large sizes. In addition, the first and second passive component modules 200A and 200B may be mounted together with other fourth and fifth passive components 224 and 225 in the second cavity 110HB, and the third passive component module 200C may be mounted together with other fourth passive components 224 having relatively large sizes in the third cavity 110HC.

In the present exemplary embodiment, the first passive component module 200A may include the first to third passive components 221, 222, and 223 having different sizes and heights. Similarly, the second passive component module 200B may also include the second and third passive components 222 and 223 having different sizes and heights. To the contrary, the third passive component module 200C may include only the third passive components 223 having the same size and height.

Entire structures of the first to third passive component modules 200A, 200B, and 200C may be determined by shapes of the resin portions 230, and may be rectangular structures (see FIG. 12). However, sizes and shapes of the entire structures of the first to third passive component modules 200A, 200B, and 200C are not limited thereto, but may be variously determined in consideration of sizes of large passive components positioned in the vicinity of the first to third passive component modules 200A, 200B, and 200C or cavities in which the first to third passive component modules 200A, 200B, and 200C are to be mounted.

In each of the first to third passive component modules 200A, 200B, and 200C, the first to third passive components 221, 222, and 223 are coupled to each other by the resin portion 230, and may thus be more densely disposed as compared to a case in which they are individually mounted. Therefore, an influence of electromagnetic waves increased as a distance between the components is increased may be decreased.

Particularly, in accordance with an increase in a size of displays for mobile apparatuses, the necessity to increase capacity of batteries has increased. Since areas occupied by the batteries in the mobile apparatuses are increased in accordance with the increase in the capacity of the batteries, a size of a printed circuit board (PCB) may be reduced by decreasing mounting areas of the components through the modularization of the passive components described above.

In the present exemplary embodiment, one surfaces of the first to third passive component modules 200A, 200B, and 200C may be provided as mounting surfaces, and connection terminals 221T, 222T, and 223T, of the plurality of passive components 221, 222, and 223 may be exposed from the mounting surfaces of the first to third passive component modules 200A, 200B, and 200C (see FIG. 13). These connection terminals may be connected to the redistribution layer 142 of the connection member 140 through vias 143.

However, the first passive component module 200A used in the present exemplary embodiment may be a module that may be tuned through selective connection of the vias 143.

In detail, as illustrated in FIG. 11, in the first passive component module 200A, the connection terminals 221T and 223T of the first and third passive components 221 and 223 may be connected to the redistribution layer 142 of the connection member 140 through the vias 143, while the connection terminals 222T of the second passive component 222 are not connected to the redistribution layer 142 of the connection member 140, such that the second passive component 222 may not be used as a circuit of the semiconductor package. Alternatively, although not shown, the connection terminals 222T of the second passive component 222 may be connected to the redistribution layer 142 of the connection member 140, such that the second passive component 222 may also be used as a circuit of the semiconductor package.

As described above, the first passive component module 200A according to the present exemplary embodiment may be configured to be used as a portion of a circuit in various packages rather than being designed to be customized to a specific package. To this end, the first passive component module 200A may include a combination and an array of several kinds of passive components.

As illustrated in FIG. 11, in the first passive component module 200A, only the first and third passive components 221 and 223 connected to the redistribution layer 142 and the vias 143 may be selectively used, the second passive component 222 may not be connected to the redistribution layer 142, and the second passive component 222 that is not connected to the redistribution layer 142 may not be configured as the circuit of the semiconductor package.

As described above, the connection terminals of some of the plurality of passive components may be connected to the redistribution layer through the vias, while the connection terminals of the others of the plurality of passive components may not be connected to the redistribution layer. Through the selective connection of the vias, the first passive component module 200A may be tuned so that only some passive components 221 and 223 are involved in the circuit of the semiconductor package.

A passivation layer 150 may be disposed on a lower surface of the connection member 140, and underbump metal layers 160 electrically connected to the redistribution layer 142 may be disposed in openings of the passivation layer 150. Electrical connection structures 170 may be electrically connected to the redistribution layer 142 through the underbump metal layers 160.

The respective components included in the semiconductor package 100 according to the present exemplary embodiment will hereinafter be described in more detail.

The core member 110 may improve rigidity of the semiconductor package 100 depending on certain materials, and serve to secure uniformity of a thickness of the encapsulant 130. As an example, the core member 110 used in the present exemplary embodiment may have the first to third cavities 110HA, 110HB, and 110HC. The semiconductor chip 120 may be disposed in the first cavity 110HA, and the first to third passive component modules 200A, 200B, and 200C may be disposed together with the plurality of passive components 224 and 225 in the second and third cavities 110HB and 110HC. The semiconductor chip 120 may be spaced apart from other passive components 224 and 225 and the passive component modules 200A, 200B, and 200C by a distance of sidewalls of the core member 110. The number and shapes of cavities may be variously modified, if necessary.

A material of the core member 110 is not particularly limited. For example, an insulating material may be used as a material of the core member 110. In this case, a thermosetting resin such as an epoxy resin, a thermoplastic resin such as a polyimide resin, a resin in which the thermosetting resin or the thermoplastic resin is impregnated together with an inorganic filler in a core material such as a glass fabric, for example, prepreg, Ajinomoto Build up Film (ABF), FR-4, Bismaleimide Triazine (BT), or the like, may be used as the insulating material. Alternatively, a PID resin may also be used as the insulating material.

The semiconductor package 100 according to the present exemplary embodiment may further include a metal layer 181, a backside metal layer 182, and backside vias 183 for blocking electromagnetic waves and dissipating heat. The metal layer 181 may be disposed on inner sidewalls of the second and third cavities 110HB and 110HC of the core member 110, and may be disposed to surround the passive components 224 and 225 and the passive component modules 200A, 200B, and 200C. The metal layer may not be formed on sidewalls of the first cavity 110HA.

The metal layer 181 may extend in a plate shape to upper and lower surfaces of the core member 110. The backside metal layer 182 may be formed in a plate shape on the encapsulant 130 to block an upper portion of the semiconductor package 100. The backside vias 183 may penetrate through the encapsulant 130 to connect the metal layer 181 and the backside metal layer 182 to each other. The metal layer 181, the backside metal layer 182, and the vias 183 may include a conductive material such as copper (Cu), or the like, and may be formed by any known plating method, or the like. If necessary, the metal layer 181 and the backside metal layer 182 may be connected to a ground of the redistribution layer 142 of the connection member 140 to be thus used as a ground. A degassing hole for discharging moisture, gas, or the like, may be formed in the backside metal layer 182.

Meanwhile, an EMI blocking structure for the redistribution layer 142 of the connection member 140 may also be implemented in the connection member 140.

The semiconductor chip 120 may be an integrated circuit (IC) provided in an amount of several hundred to several million or more elements integrated in a single chip. In this case, the integrated circuit may be, for example, a power management IC (PMIC), but is not limited thereto. Meanwhile, the semiconductor chip 120 may be an integrated circuit in a bare state in which a separate bump or redistribution layer is not formed. The integrated circuit may be formed on the basis of an active wafer. In this case, a base material of a body of the semiconductor chip 120 may be silicon (Si), germanium (Ge), gallium arsenide (GaAs), or the like. Various circuits may be formed on the body. The connection pads 120P may electrically connect the semiconductor chip 120 to other components. A material of each of the connection pads 120P may be a conductive material such as aluminum (Al), or the like. A passivation layer (not shown) exposing the connection pads 120P may be formed on the body, and may be an oxide film, a nitride film, or the like, or a double layer of an oxide layer and a nitride layer. An insulating layer, and the like, may further be disposed in other required positions.

The encapsulant 130 may encapsulate at least portions of the core member 110, the semiconductor chip 120, the plurality of passive components 224 and 225, and the passive component modules 200A, 200B, and 200C. In addition, the encapsulant 130 may fill at least portions of the first to third cavities 110HA, 110HB, and 110HC. The encapsulant 130 may include an insulating material. The insulating material may be a material including an inorganic filler and an insulating resin, for example, a thermosetting resin such as an epoxy resin, a thermoplastic resin such as a polyimide resin, a resin having a reinforcing material such as an inorganic filler impregnated in the thermosetting resin and the thermoplastic resin, such as ABF, FR-4, BT, or the like. In addition, any known molding material such as an epoxy molding compound (EMC), or the like, may be used, and a photoimagable encapsulant (PIE) may be used, if necessary.

Alternatively, a material in which an insulating resin such as a thermosetting resin or a thermoplastic resin is impregnated in an inorganic filler and/or a core material such as a glass fabric may also be used as the insulating material.

The connection pads 120P of the semiconductor chip 120 may be extended and redistributed using the redistribution layer 142 of the connection member 140, and the semiconductor chip 120 and the passive components 221 to 225 may be electrically connected to each other by the redistribution layer 142. Several tens to several hundreds of connection pads 120P of the semiconductor chip 120 having various functions may be redistributed by the connection member 140, and may be physically or electrically externally connected through the electrical connection structures 170 depending on the functions. The connection member 140 may include insulating layers 141, redistribution layers 142 disposed on the insulating layers 141, and vias 143 penetrating through the insulating layers 141 and connecting the redistribution layers 142 to each other. The connection member 140 may be formed of a single layer, or may be formed of layers of which the number is greater than that illustrated in the drawings.

A material of each of the insulating layers 141 may be an insulating material. In this case, a photosensitive insulating material such as a PID resin may also be used as the insulating material. That is, the insulating layer 141 may be a photosensitive insulating layer. When the insulating layer 141 has photosensitive properties, the insulating layer 141 may be formed to have a smaller thickness, and a fine pitch of the via 143 may be achieved more easily. The insulating layer 141 may be formed of a photosensitive insulating resin including an insulating resin and an inorganic filler. When the insulating layers 141 are multiple layers, materials of the insulating layers 141 may be the same as each other, and may also be different from each other, if necessary. When the insulating layers 141 are the multiple layers, the insulating layers 141 may be integrated with each other depending on a process, such that a boundary therebetween may also not be apparent.

The redistribution layers 142 may serve to substantially redistribute the connection pads 120P. Each of the redistribution layers 142 may include, for example, a conductive material such as copper (Cu), aluminum (Al), silver (Ag), tin (Sn), gold (Au), nickel (Ni), lead (Pb), titanium (Ti), or alloys thereof. The redistribution layers 142 may perform various functions depending on designs of corresponding layers. For example, the redistribution layers 142 may include ground (GND) patterns, power (PWR) patterns, signal (S) patterns, and the like. Here, the signal (S) patterns may include various signals except for the ground (GND) patterns, the power (PWR) patterns, and the like, such as data signals, and the like. In addition, the redistribution layers 142 may include via pads, connection terminal pads, and the like.

The vias 143 may electrically connect the redistribution layers 142, the connection pads 120P, the connection terminals of the passive components 221 to 225, and the like, formed on different layers to each other, resulting in reconfiguration of an electrical path in the semiconductor package 100. The vias 143 may include, for example, a conductive material such as copper (Cu), aluminum (Al), silver (Ag), tin (Sn), gold (Au), nickel (Ni), lead (Pb), titanium (Ti), or alloys thereof. Each of the vias 143 may be completely filled with the conductive material, and may have various shapes such as a tapered shape and a cylindrical shape.

The connection member 140 may include a heat dissipation structure (not illustrated) disposed on the active surface of the semiconductor chip 120. The heat dissipation structure may have a stack via form, but is not limited thereto. The heat dissipation structure may be connected to the mainboard through the electrical connection structures 170 to effective dissipate heat generated from the semiconductor chip 120.

The passivation layer 150 may protect the connection member 140 from external physical or chemical damage. The passivation layer 150 may have the openings exposing at least portions of the redistribution layer 142 of the connection member 140. The number of openings formed in the passivation layer 150 may be several tens to several thousands. The passivation layer 150 may include an insulating resin and an inorganic filler, but may not include a glass fabric. For example, the passivation layer 150 may be formed of ABF or a solder resist, but is not limited thereto.

The underbump metal layers 160 may be improve connection reliability of the electronic connection structures 170, resulting in improvement of board level reliability of the semiconductor package 100. The underbump metal layers 160 may be connected to the redistribution layer 142 of the connection member 140 exposed through the openings of the passivation layer 150. The underbump metal layers 160 may be formed in the openings of the passivation layer 150 by any known metallization method using any known conductive material such as a metal, but are not limited thereto.

The electrical connection structures 170 may be additionally configured to physically or electrically externally connect the semiconductor package 100. For example, the semiconductor device 100 may be mounted on the mainboard of the electronic device through the electrical connection structures 170. Each of the electrical connection structures 170 may be formed of a conductive material, for example, a low melting point metal such as an Sn—Al—Cu alloy. Each of the electrical connection structures 170 may be a land, a ball, a pin, or the like. The electrical connection structures 170 may be formed as a multilayer or single layer structure. When the electrical connection structures 170 are formed as a multilayer structure, the electrical connection structures 170 may include a copper (Cu) pillar and a ball formed of a low melting point metal. When the electrical connection structures 170 are formed as a single layer structure, the electrical connection structures 170 may include a tin-silver solder or copper (Cu). However, the electrical connection structures 170 are not limited thereto. The number, an interval, a disposition form, and the like, of electrical connection structures 170 are not particularly limited. For example, the electrical connection structures 170 may be provided in an amount of several tens to several thousands according to the number of connection pads 120P, or may be provided in an amount of several tens to several thousands or more or several tens to several thousands or less.

At least some of the electrical connection structures 170 may be disposed in a fan-out region. Here, the fan-out region refers to a region except for the region in which the semiconductor chip 120 is disposed. A fan-out package may have excellent reliability as compared to a fan-in package, may implement a plurality of input/output (I/O) terminals, and may facilitate a 3D interconnection. In addition, as compared to a ball grid array (BGA) package, a land grid array (LGA) package, or the like, the fan-out package may be manufactured to have a small thickness.

A method of manufacturing the passive component module used in the semiconductor package according to the present exemplary embodiment will hereinafter be described.

FIGS. 14A through 14D are cross-sectional views for describing main processes of a method of manufacturing the passive component module used in the semiconductor package illustrated in FIG. 9. The method of manufacturing the passive component module according to the present exemplary embodiment may be understood as a method of manufacturing the first passive component module 200A illustrated in FIGS. 12 and 13.

Figure 14A:
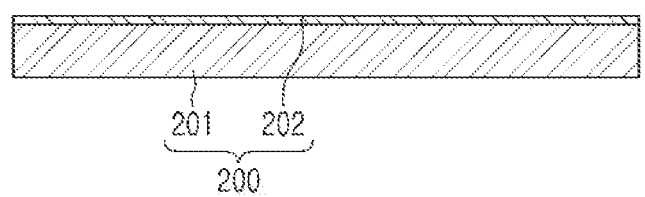
FIGS. 14A through 14D are cross-sectional views for describing main processes of a method of manufacturing the passive component module used in the semiconductor package illustrated in FIG. 9.

First, referring to FIG. 14A, the first to third passive components 221, 222, and 223 may be aligned on a carrier substrate 200.

The present process may be a process of manufacturing two modules as an example, and the first to third passive components 221, 222, and 223 may be more densely arranged as compared to a surface mounting technology (SMT) process, and mounting areas of the passive components may thus be significantly decreased as compared to a case of individually mounting the same combination of passive components on a printed circuit board. The carrier substrate 200 may include a support layer 201 and a metal foil 202 formed on at least one surface of the support layer 201. The support layer 201 may be formed of prepreg, and the metal foil 202 may be a plurality of coil foil portions. However, the support layer 201 and the metal foil 202 are not limited thereto.

Figure 14B:
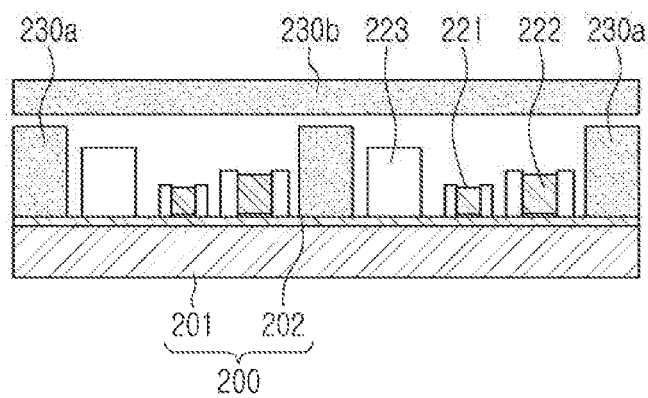
Figure 14C:
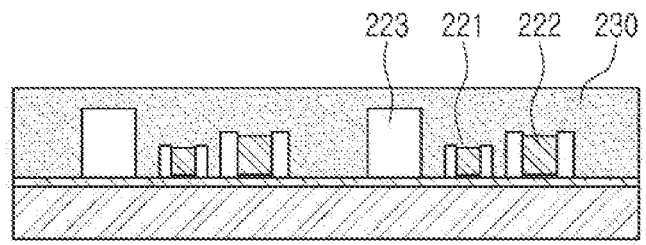

Then, referring to FIGS. 14B and 14C, a process of forming the resin portion 230 to surround the first to third passive components 221, 222, and 223 may be performed.

In the present process, the resin portion 230 may be formed by disposing a first resin body 230a, which is a sidewall structure surrounding array regions of the respective passive components, and disposing a second resin body 230b on the first resin body 230a in order to encapsulate the array regions of the respective passive components, as illustrated in FIG. 14B.

The first resin body 230a, which is the sidewall structure, may be provided in advance on the carrier substrate 200 to suppress the first to third passive components 221, 222, and 223 from being separated in the process of forming the resin portion. For example, the first resin body 230a may be an insulating resin body such as prepreg in which the array regions of the passive components are punched. For example, the second resin body 230b may be formed using prepreg, ABF, or a PID resin.

An encapsulating process using the second resin body 230b may be performed by a lamination process, as illustrated in FIG. 14B. At least one of the first and second resin bodies 230a and 230b may be formed of the same material as that of the encapsulant 130, if necessary.

Figure 14D:
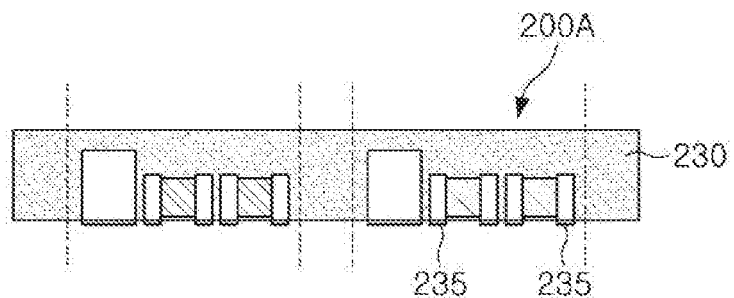

Then, referring to FIG. 14D, the carrier substrate 200 may be removed, connection electrode layers 235 may be formed on exposed surfaces of connection terminals, and the passive component module may then be cut in an individual module unit.

The support layer 201 of the carrier substrate 200 may be removed using the metal foil 202. The remaining metal foil 202 may be removed by etching. After the carrier substrate 200 is removed, the connection electrode layers 235 may be formed on the exposed surfaces of the connection terminals in order to facilitate a process of connecting the passive component module and the redistribution layer to each other. For example, the connection electrode layers 235 may be formed of Sn, Cu, and alloys thereof, and may be formed by a sputtering process using a mask.

Figure 15:
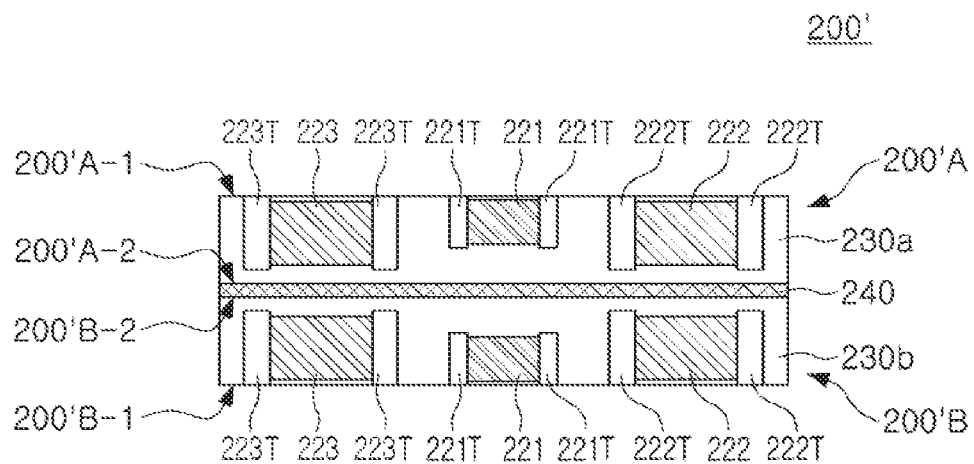
FIG. 15 is a schematic cross-sectional view illustrating a stack-type passive component module according to an exemplary embodiment in the present disclosure.

FIG. 15 is a schematic cross-sectional view illustrating a stack-type passive component module according to an exemplary embodiment in the present disclosure.

Referring to FIG. 15, a stack-type passive component module 200' according to the present exemplary embodiment may include first and second passive component modules 200'A and 200'B including, respectively, a plurality of passive components 221, 222, and 223 and resin portions 230a and 230b encapsulating the plurality of passive components 221, 222, and 223. The first and second passive component modules 200'A and 200'B may have, respectively, first surfaces 200'A-1 and 200'B-1 from which connection terminals 221T, 222T, and 223T of the plurality of passive components 221, 222, and 223 are exposed and second surfaces 200'A-2 and 200'B-2 opposing the first surfaces 200'A-1 and 200'B-1.

In the stack-type passive component module 200' according to the present exemplary embodiment, the second surfaces 200'A-2 and 200'B-2 of the first and second passive component modules 200'A and 200'B may be bonded to each other to face each other, such that the first surfaces 200'A-1 and 200'B-1 of the first and second passive component modules 200'A and 200'B may be provided as upper and lower surfaces, respectively.

As illustrated in FIG. 15, the second surfaces 200'A-2 and 200'B-2 of the first and second passive component modules 200'A and 200'B may be bonded to each other by an adhesion layer 240 such as a die attach film (DAF). The first and second passive component modules 200'A and 200'B used in the present exemplary embodiment may further include connection electrode layers (not illustrated, but similar to the connection electrode layers 235 shown in FIG. 14D) disposed on connection terminals 221T, 222T, and 223T exposed from the first surfaces 200'A-1 and 200'B-1 and protruding from the first surfaces 200'A-1 and 200'B-1, as in the example described with reference to FIG. 14D.

Figure 16:
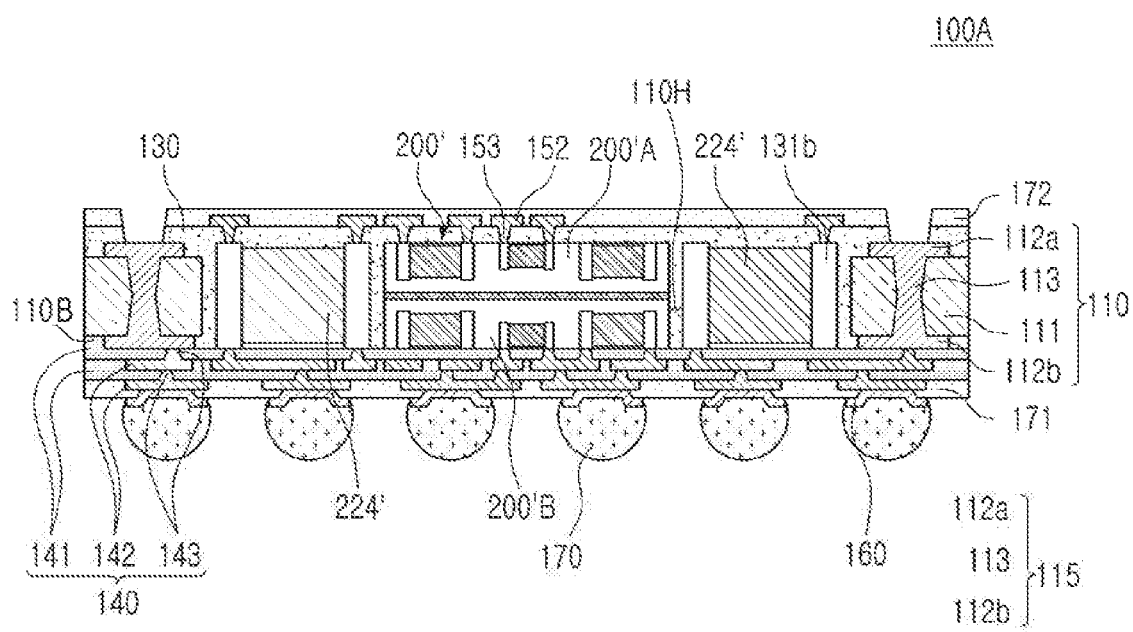
FIG. 16 is a cross-sectional view illustrating a semiconductor package in which the stack-type passive component module illustrated in FIG. 15 is used.

FIG. 16 is a cross-sectional view illustrating a semiconductor package in which the stack-type passive component module illustrated in FIG. 15 is used. It may be understood that a semiconductor package illustrated in FIG. 16 is similar to the semiconductor package illustrated in FIGS. 9 and 10 although a semiconductor chip is not illustrated in FIG. 16 and a cross section of a cavity 110H (for example, a second cavity 110HB) in which passive components are mounted is illustrated.

Referring to FIG. 16, it may be understood that a semiconductor package 100A according to the present exemplary embodiment has a structure similar to that illustrated in FIGS. 9 and 10 except that the stack-type passive component module 200', a core member 110 having a wiring structure 115, and a second redistribution layer 152 and vias 153 are formed. Components according to the present exemplary embodiments may be understood with reference to the description for the same or similar components of the semiconductor package 100 illustrated in FIGS. 9 and 10 unless explicitly described to the contrary.

The core member 110 may include a dielectric layer 111 and the wiring structure 115 connecting upper and lower surfaces of the dielectric layer 110 to each other. The wiring structure 115 may include first and second wiring layers 112a and 112b disposed on opposite surfaces of the dielectric layer 111, respectively, and through-vias 113 penetrating through the dielectric layer 111 and connecting the first and second wiring layers 112a and 112b to each other. The second wiring layer 112b of the core member 110 may be connected to a first redistribution layer 142 of a connection member 140 disposed on a second surface 110B of the core member 110. The semiconductor package 100A according to the present exemplary embodiment may be utilized as a package for a package-on-package (PoP).

In the stack-type passive component module 200', the first surface 200'B-1 of the second passive component module 200'B may be provided as a mounting surface in contact with the connection member 140. The first redistribution layer 142 of the connection member 140 may be connected to some of the connection terminals 221T, 222T, and 223T of the second passive component module 200'B of the stack-type passive component module 200' together with connection pads (not illustrated) of a semiconductor chip through vias 143, and the first redistribution layer 142 of the connection member 140 may not be connected to one of the connection terminals 221T, 222T, and 223T of the second passive component module 200'B. Alternatively, the first redistribution layer 142 of the connection member 140 may be connected to all of the connection terminals 221T, 222T, and 223T of the second passive component module 200'B of the stack-type passive component module 200' together with connection pads (not illustrated) of a semiconductor chip through vias 143.

An encapsulant 130 may cover a first surface 110A of the core member 110, and encapsulate the stack-type passive component module 200' and the semiconductor chip (not illustrated). A second redistribution layer 152 may be disposed on a surface of the encapsulant 130, and may be connected to some of the connection terminals 221T, 222T, and 223T of the second passive component module 200'A through vias 153, and the second redistribution layer 152 may not be connected to one of the connection terminals 221T, 222T, and 223T of the second passive component module 200'A. Alternatively, the second redistribution layer 152 may be connected to all of the connection terminals 221T, 222T, and 223T of the first passive component module 200'A of the stack-type passive component module 200'. As in the present exemplary embodiment, other passive components 224' may be connected to both of the first redistribution layer 142 and the second redistribution layer 152, if necessary.

First and second passivation layers 171 and 172 may be configured to protect the connection member 140 and the second redistribution layer 152, respectively, from external physical or chemical damage, or the like. The second passivation layer 172 may have openings exposing at least portions of the first wiring layer 112a.

A material of each of the first and second passivation layers 171 and 172 is not particularly limited. For example, a solder resist may be used as the material of each of the first and second passivation layers 171 and 172. In some exemplary embodiments, a material (for example, a PID resin, an ABF, or the like) that is the same as or similar to the insulating material used as the material of the core member 110 and/or the connection member 140 may be used as the material of each of the passivation layers 171 and 172.

As set forth above, according to the exemplary embodiments in the present disclosure, the plurality of passive components may be modularized in advance and be tuned through the selective connection of the vias to be thus used as a module appropriate for various package circuits. Meanwhile, the stack-type passive component module configured so that the connection terminals are exposed from opposite surfaces opposing each other may be provided to further improve mounting properties and be usefully utilized for a package including a backside redistribution layer.

While exemplary embodiments have been shown and described above, it will be apparent to those skilled in the art that modifications and variations could be made without departing from the scope of the present invention as defined by the appended claims.

What is claimed is:

1. A semiconductor package comprising:
a core member having first and second surfaces opposing each other and having a cavity penetrating through the first and second surfaces;
a semiconductor chip disposed in the cavity of the core member and having an active surface having connection pads disposed thereon;
a passive component module disposed in the cavity of the core member, including a plurality of passive components and a resin portion encapsulating the plurality of passive components, and having a mounting surface from which connection terminals of the plurality of passive components are exposed, the plurality of passive components having at least one first passive component and at least one second passive component;
a connection member disposed on the second surface of the core member and including a redistribution layer connected to the connection pads of the semiconductor chip and connection terminals of the at least one first passive component, and connection terminals of the at least one second passive component not being electrically connected to the redistribution layer; and
an encapsulant encapsulating the passive component module and the semiconductor chip disposed in the cavity,
wherein the semiconductor chip, the redistribution layer and the at least one first passive component constitute a circuit of the semiconductor package, and the at least one second passive component is not provided as part of the circuit.

2. The semiconductor package of claim 1, wherein at least one of sizes and heights of the plurality of passive components are different from each other.

3. The semiconductor package of claim 1, wherein the cavity includes at least first and second cavities, and
the semiconductor chip is disposed in the first cavity, and the passive component module is disposed in the second cavity.

4. The semiconductor package of claim 3, wherein the second cavity includes a plurality of second cavities, and
the passive component module includes a plurality of passive component modules disposed, respectively, in the plurality of second cavities.

5. The semiconductor package of claim 1, further comprising at least one passive component disposed in the cavity of the core member and having a size or a height greater than that of the plurality of passive components of the passive component module.

6. The semiconductor package of claim 1, wherein the core member includes a wiring structure connecting the first and second surfaces to each other.

7. The semiconductor package of claim 6, further comprising an additional redistribution layer connected to the wiring structure on the first surface of the core member and disposed on a surface of the encapsulant.

8. The semiconductor package of claim 1, wherein the passive component module further includes connection electrode layers disposed on the connection terminals exposed from the mounting surface and protruding from the mounting surface.

9. A stack-type passive component module comprising:
first and second passive component modules including, respectively, a plurality of passive components and resin portions encapsulating the plurality of passive components, and having, respectively, first surfaces from which connection terminals of the plurality of passive components are exposed and second surfaces opposing the first surfaces,
wherein the second surfaces of the first and second passive component modules face each other, and the first surfaces of the first and second passive component modules are provided as upper and lower surfaces, respectively, and
wherein the second surfaces of the first and second passive component modules are bonded to each other by an adhesion layer.

10. The stack-type passive component module of claim 9, wherein each of the first and second passive component modules further includes connection electrode layers disposed on the connection terminals exposed from the first surface and protruding from the first surface.

11. A semiconductor package comprising:
a core member having first and second surfaces opposing each other, having a cavity penetrating through the first and second surfaces, and including a wiring structure connecting the first and second surfaces to each other;
a semiconductor chip disposed in the cavity of the core member and having an active surface having connection pads disposed thereon;
a stack-type passive component module disposed in the cavity of the core member, the stack-type passive component module comprising:
first and second passive component modules including, respectively, a plurality of passive components and resin portions encapsulating the plurality of passive components, and having, respectively, first surfaces from which connection terminals of the plurality of passive components are exposed and second surfaces opposing the first surfaces,
wherein the second surfaces of the first and second passive component modules face each other, and the first surfaces of the first and second passive component modules are provided as upper and lower surfaces, respectively;
a connection member disposed on the second surface of the core member and including a first redistribution layer connected to the connection pads of the semiconductor chip and the connection terminals of some of the first and second passive components disposed on the lower surface of the stack-type passive component module, the connection terminals of the others of the first and second passive components disposed on the lower surface of the stack-type passive component module not being connected to the first redistribution layer;
an encapsulant covering the first surface of the core member and encapsulating the stack-type passive component module and the semiconductor chip; and
a second redistribution layer disposed on the encapsulant and connected to the wiring structure of the core member and the connection terminals of some of the first and second passive components disposed on the upper surface of the stack-type passive component module, the connection terminals of the others of the first and second passive components disposed on the upper surface of the stack-type passive component module not being connected to the second redistribution layer.

* * * * *